United States Patent
Togami et al.

(10) Patent No.: US 6,817,782 B2
(45) Date of Patent: Nov. 16, 2004

(54) OPTICAL MODULE WITH SIMPLEX PORT CAP EMI SHIELD

(75) Inventors: Chris Togami, San Jose, CA (US); Gary D. Sasser, San Jose, CA (US); Kai Ng, Sunnyvale, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/367,435

(22) Filed: Feb. 13, 2003

(65) Prior Publication Data

US 2003/0156802 A1 Aug. 21, 2003

Related U.S. Application Data

(60) Provisional application No. 60/357,190, filed on Feb. 15, 2002.

(51) Int. Cl.[7] .................................................. G02B 6/36
(52) U.S. Cl. ............................. 385/92; 385/93; 385/89
(58) Field of Search ....................................... 385/88–94

(56) References Cited

U.S. PATENT DOCUMENTS

| | | | | |
|---|---|---|---|---|
| 4,979,787 A | * | 12/1990 | Lichtenberger | 385/88 |
| 5,852,257 A | * | 12/1998 | Dittman et al. | 174/59 |
| 5,966,487 A | * | 10/1999 | Gilliland et al. | 385/92 |
| 6,085,006 A | * | 7/2000 | Gaio et al. | 385/92 |
| 6,200,041 B1 | | 3/2001 | Gaio et al. | |
| 6,283,644 B1 | * | 9/2001 | Gilliland et al. | 385/93 |
| 6,304,436 B1 | | 10/2001 | Branch et al. | |
| 6,335,869 B1 | | 1/2002 | Branch et al. | |
| 6,659,655 B2 | * | 12/2003 | Dair et al. | 385/92 |
| 2002/0131122 A1 | | 9/2002 | Anderi et al. | |

OTHER PUBLICATIONS

William K. Hogan, David P. Gaio, Mitchell S. Cohen, and Jean M. Trewhella, A Novel Low–Cost Small–Form–Factor Transceiver Module, MicroNews Third Quarter 2000, vol. 6, No. 3.

* cited by examiner

*Primary Examiner*—John D. Lee
*Assistant Examiner*—Sarah U Song
(74) *Attorney, Agent, or Firm*—Workman Nydegger

(57) ABSTRACT

An optical module has port housing comprised of a material that does not substantially shield EMI, such as an optical plastic. The port housings have a receiving ferrule disposed in an aperture of an electrically conductive shell. The ferrule is movably coupled to the shell to permit it to respond to loads imposed by an optical fiber connector and includes an electrically conductive cap to shield a portion of the port housing proximate the ferrule.

37 Claims, 9 Drawing Sheets

OPTICAL MODULE WITH SIMPLEX PORT CAP EMI SHIELD

CROSS-REFERENCE TO RELATED APPLICATION

This application claims priority under 35 U.S.C. §119(e) to U.S. Provisional Patent Application No. 60/357,190, entitled "Optical Module With Simplex Port Cap EMI Shield," filed Feb. 15, 2002, the contents of which are hereby incorporated by reference in their entirety.

BACKGROUND OF THE INVENTION

1. Field of the Invention

The present invention relates generally to electromagnetic interference (EMI) shields for transceiver and transponder modules.

2. Description of the Related Art

It is desirable to provide electromagnetic interference (EMI) shielding in transceiver and transponder modules. One portion of a transceiver/transponder module for which EMI shielding is desirable is in a fiber connector end of the module. High-speed electronics, such as transmitter or receiver circuits operating at data rates greater than 1 Gb/s, may generate significant EMI if not properly shielded. Consequently, in many applications EMI shielding is required.

One application requiring EMI shielding of port housings is a small form factor transceiver, including both hot-pluggable and non-pluggable (i.e., hard soldered) varieties. An industry-wide Multi-Source Agreement (MSA) governs the size and pin arrangement of small form factor transceivers. Conventionally, the port housings of a transceiver/transponder module are fabricated from metal. However, there is increasing interest in plastic port housings. Plastic port housings provide several potential advantages, such as the ability to integrate a plastic lens into the housing. However, compared with metal port housings, plastic port housings have lower mechanical strength. Moreover, plastic port housings may suffer more from thermal stress. Additionally, plastic port housing are more difficult to shield from EMI.

Therefore what is desired is an EMI shield compatible with the requirements of plastic port housings and which has desirable EMI shielding and mechanical properties.

SUMMARY OF THE INVENTION

An optical transceiver/transponder module includes optical sub-assemblies having port housing fabricated from an optical plastic or other insulating material. The neck portion of each port housing is supported within an electrically conductive yoke. An electrically conductive cap on the port housing provides additional EMI shielding of the optical sub-assemblies in addition to that provided by the yoke. In one embodiment, each optical sub-assembly comprises: an optical port housing formed of a non-conductive material and having a body portion having an open receptacle end and an optical coupling end, a ferrule portion having a bore shaped to receive an optical fiber; a neck portion connecting the optical coupling end of the body portion to the bore of the ferrule portion; an active optical device disposed in the receptacle end of the body portion of the optical port housing; and an electrically conductive cap disposed on an outer surface of the port housing to reduce electromagnetic interference.

BRIEF DESCRIPTION OF THE DRAWINGS

The invention has other advantages and features which will be more readily apparent from the following detailed description of the invention and the appended claims, when taken in conjunction with the accompanying drawings, in which:

The figures depict a preferred embodiment of the present invention for purposes of illustration only. One of skill in the art will readily recognize from the following discussion that alternative embodiments of the structures and methods disclosed herein may be employed without departing from the principles of the claimed invention.

DETAILED DESCRIPTION OF THE PREFERRED EMBODIMENTS

Figure 1A:
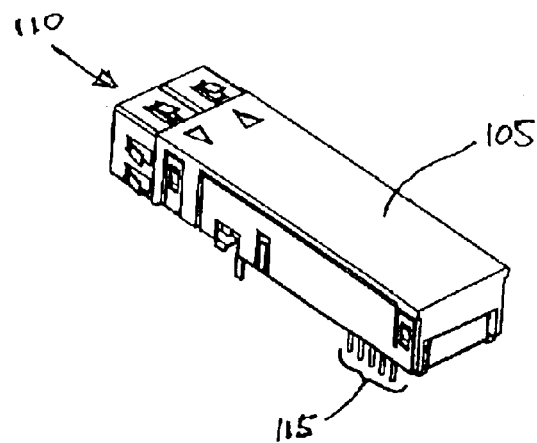
FIG. 1A is a perspective view of a non-pluggable small form factor transceiver.

FIG. 1A is a top perspective view of an example of a non-pluggable small form factor transceiver, such as those manufactured by the Finisar Corporation of Sunnyvale, Calif. In this example, an internal optical module (e.g., see FIG. 2A), for example a transceiver module or transponder module, is housed inside a shell 105 with appropriate pin connectors 115 for communicating with internal electronics. The transceiver is hard soldered or otherwise attached to a printed circuit board. It is non-pluggable in the sense that it is difficult to change the internal optical module without first detaching the device from the printed circuit board.

Figure 1B:
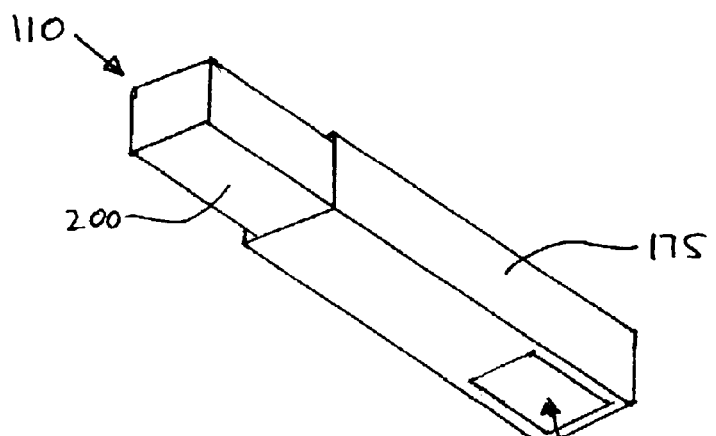
FIG. 1B is a perspective view of a hot-pluggable small form factor transceiver.

FIG. 1B is a bottom perspective view of an example of a hot-pluggable small form factor transceiver, such as those manufactured by the Finisar Corporation of Sunnyvale, Calif. In this approach, a cage housing 175 is soldered or otherwise attached to a printed circuit board. It has an open end 110 to permit an optical module 200 to be inserted/removed. A bottom open portion 185 of cage 175 permits an electrical interface connector, such as pins, to be located within cage 175. In this manner, electrical connection can be made with internal electronics. The design is hot-pluggable since the internal optical module 200 may be changed by removing (by sliding, in this case) the current module and replacing it with a different module, without detaching the cage housing 175 from the printed circuit board.

Figure 1C:
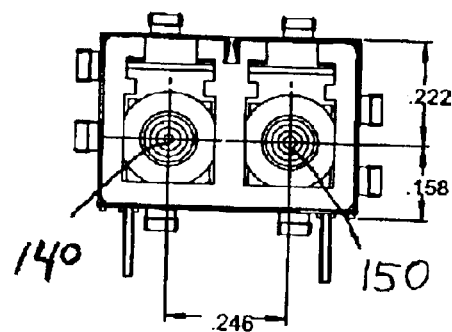
FIG. 1C is a connector end view of the small form factor transceiver of FIG. 1A.

FIG. 1C shows a view of an internal transceiver module from the fiber connector end 110. In this example, the transceiver is non-pluggable but the following remarks also apply to the hot-pluggable variety. Two ferrules 140 and 150 include bores to receive and guide optical fibers into position. The fiber connector end 110 may be designed to accept any suitable dual fiber connector, such as an LC type, SC, or MT-RJ type connector.

The present invention generally comprises an optical module having an EMI shield integrated onto each port housing to reduce the aperture for EMI emission and to provide an additional ESD protection path.

Figure 2A:
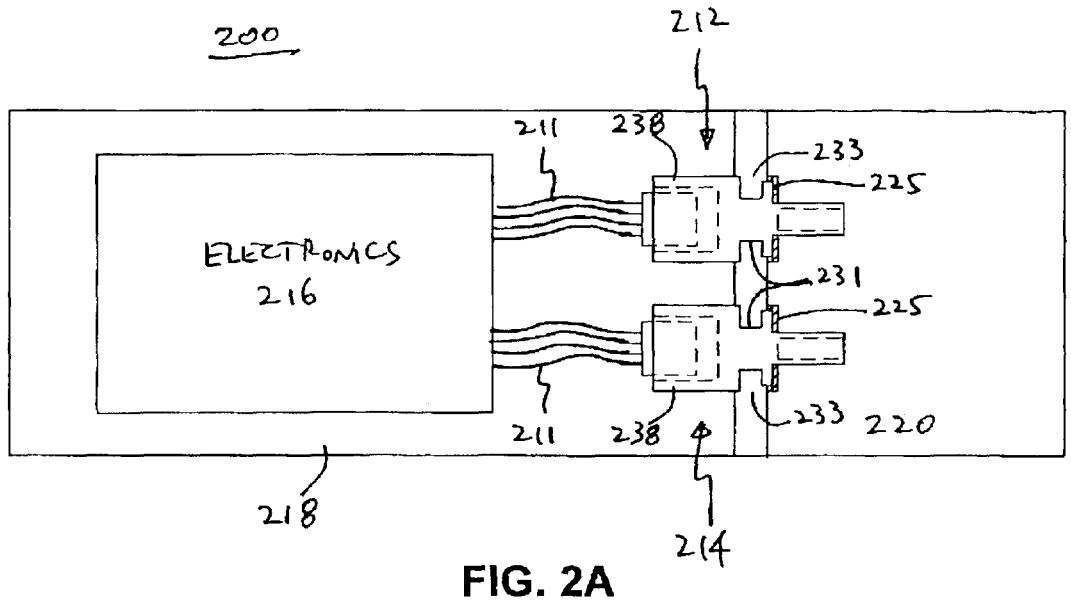
FIG. 2A is a block diagram of one embodiment of a transceiver module utilizing port housing EMI shields in accord with the present invention.

FIG. 2A depicts a top view of one embodiment of an optical module 200 having components disposed in a conductive shell 218 in accord with one embodiment of the present invention. The following example is a pluggable transceiver module, but the optical module may be either a transceiver or transponder module, including both non-pluggable and pluggable varieties. During normal use, optical module 200 is inserted into cage housing 175.

Transceiver module 200 includes a transmitter optical subassembly (TOSA) 212, which includes a light source capable of being modulated, such as a laser transmitter, Tx. A receiver optical subassembly (ROSA) 214 includes an optical detector. Each optical subassembly (OSA) is electrically coupled to a printed circuit board assembly (PCBA) 216 having respective transmitter and receiver electronic circuits. In one embodiment, each OSA is coupled to the PCBA 216 using its own flex electrical connector 211.

The OSAs are disposed in an electrically conductive shell 218. A neck portion 231 of a port housing 238 for the OSA is located in an electrically conductive yoke 233, proximate a fiber connector end 220. An electrically conductive restraining bar 232 (not shown in FIG. 2A) seats onto the portion of the necks 231 not supported by yoke 233. Yoke 233 and restraining bar 232 are electrically coupled to the shell 218 and provide EMI shielding with respect to the fiber connector end 220.

Figure 2B:
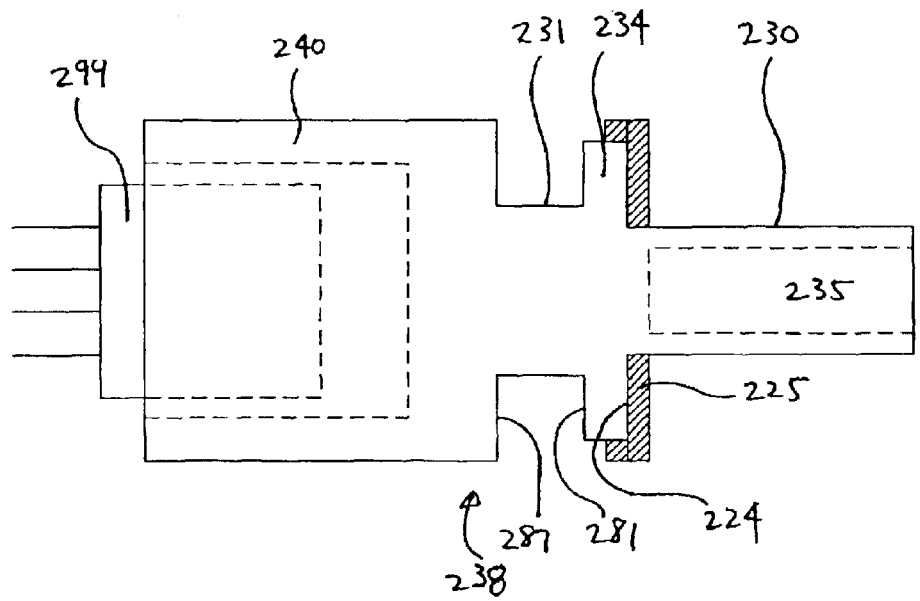
FIG. 2B is a plan view illustrating an individual optical sub-assembly.
Figure 2C:
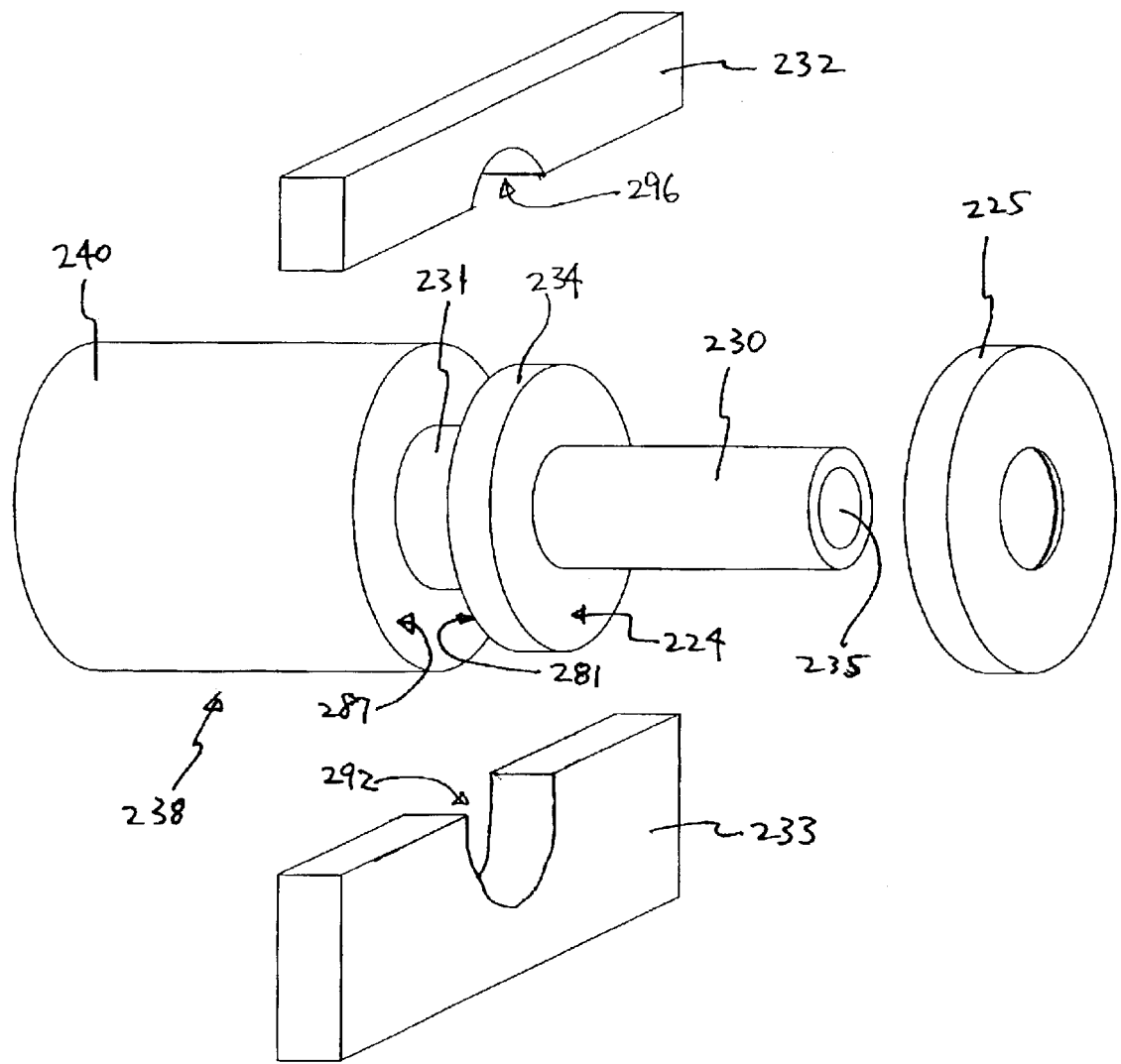
FIG. 2C is an exploded perspective view of a port housing, a portion of a yoke, and a portion of a restraining bar.

FIGS. 2B–2C illustrate aspects of the port housing 238, yoke 233, and restraining bar 232. FIG. 2B is a side view of the port housing 238. FIG. 2C is an exploded perspective view of the port housing 238, yoke 233, and restraining bar 232. An individual OSA has a port housing 238 comprising a body portion 240, a neck portion 231, and a ferrule head portion 230. Body portion 240 has a receptacle end shaped to house a header 299, such as a receiver or transmitter header 299. The neck portion 231 is bounded by a first stop surface 287 disposed on body portion 240 and a second stop surface 281 disposed on an inner surface of collar 234. Collar 234 defines an annulus about the ferrule head end 230, which has a diameter less than that of the body portion. Ferrule head end 230 includes a bore 235 with a bore opening for receiving an optical fiber.

An electrically conductive cap 225 is disposed on an outer surface 224 of collar 234. The conductive cap 225 may be formed on the port housing 238 or be fitted onto the port housing. Referring to FIG. 2C which show half of an electrically conductive yoke 233 and electrically conductive port restraining bar 232, neck 231 is shaped to be held in a yoke 233 having a region 292 preferably shaped to form a slide-in or snap-in connection. A restraining bar 232 is shaped to fit about the portion of neck 231 not held in yoke 233. The shape of the yoke 233 and port restraining bar (PRB) 232 may be selected in combination with the separation of stop surfaces 287 and 281 to permit a limited range of motion of neck 231 with respect to yoke 233.

The port housing 238 of each OSA may be fabricated from a material that does not significantly block EMI, such as a composite plastic with optical grade plastic in regions that are used to couple light. The use of plastic port housings permits a plastic lens (not shown) to be incorporated into the port housing to couple light between the OSA and an optical fiber (not shown) in the bore 235 of a receiving ferrule 230 of the port housing. Electrically conductive cap 225 provides additional shielding on the front surface 224 of collar 234. Conductive cap 225 is preferably shaped so that an electrical contact is made along at least one point of cap 225 to restraining bar 232 or yoke 233 to provide a path to ground via the shell 218. Alternately, the cap 225 may make direct electrical contact with the shell 218. Consequently, cap 225 provides an additional conductive surface that attenuates EMI and grounds ESD.

Cap 225 provides an aperture through which EMI passes, which increases the attenuation for EMI. Note that cap 225 may shield substantially the entire annular region of collar 234, forming an aperture having a smaller diameter than body portion 240. In some embodiments, cap 225 may form an aperture having a smaller diameter than neck 231.

Referring again to FIGS. 2B–2C, compliant movement of the port housings 238 is facilitated by coupling the OSAs to the PCBA 216 with a flexible connector 211. In one embodiment each OSA is electrically coupled to its corresponding PCB electronics by its own flex connector, in order to facilitate each port housing moving independently of the other port housings in response to loads. Microwave frequency flex connectors may, for example, comprise microwave transmission lines formed or embedded within a flexible material. Port restraining bar 232 may be shaped to apply a sufficient pressure such that neck portion 231 may move in response to light loads.

Figure 3:
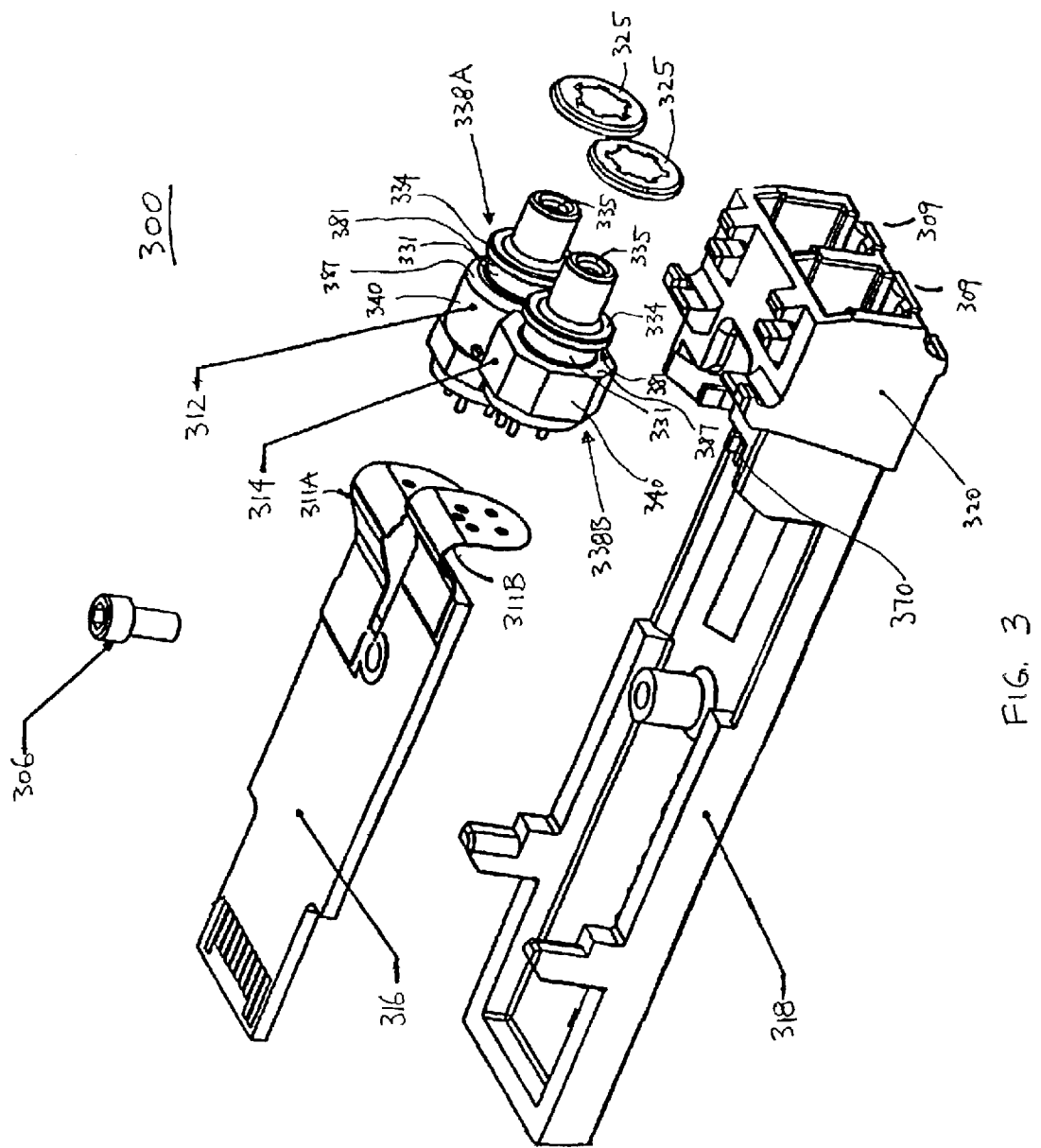
FIG. 3 is an exploded perspective view of one embodiment of a module of the present invention.

FIG. 3 is a perspective exploded view of one embodiment of a small form factor optical transceiver module 300. In an electronics section of the shell 318, PCBA 316 is used to mount receiver and transmitter electronics (not shown in FIG. 3). The PCBA 316 may be attached to a shell 318 using a suitable fastener 306, such as a bolt or screw. Shell 318 is preferably an electrically conductive shell, such as shell comprised of a metal or having a metal foil. Two flex circuits 311A and 311B are attached to the PCBA to provide separate flexible electrical connections to the pins of the device headers of each OSA. A laser transmitter OSA (TOSA) 312 is disposed within a first port housing 338. A photodiode receiver OSA (ROSA) 314 is disposed within a second port housing 338.

Each port housing 338 includes a collar 334. Each port housing includes a first stop surface 387 of body end 340 and a second stop surface 381 of collar 334. The bore 335 of the port housing is shaped to receive an optical fiber. It has a smaller outer diameter than the body end of the port housing that houses the OSA receiver or transmitter electronics. An electrically conductive cap 325 is shaped to fit onto the each annular portion of collar 334, extending over the front and side surfaces of the lip to form a conductive sleeve around the rim of the collar 334. In one embodiment, the connector receptacles 309 have front openings shaped to receive a dual fiber connector, such as an LC type connector in the fiber connector end 320 of the module. A portion of shell 318 has a region 370 shaped to receive a restraining bar (not shown in FIG. 3).

Figure 4A:
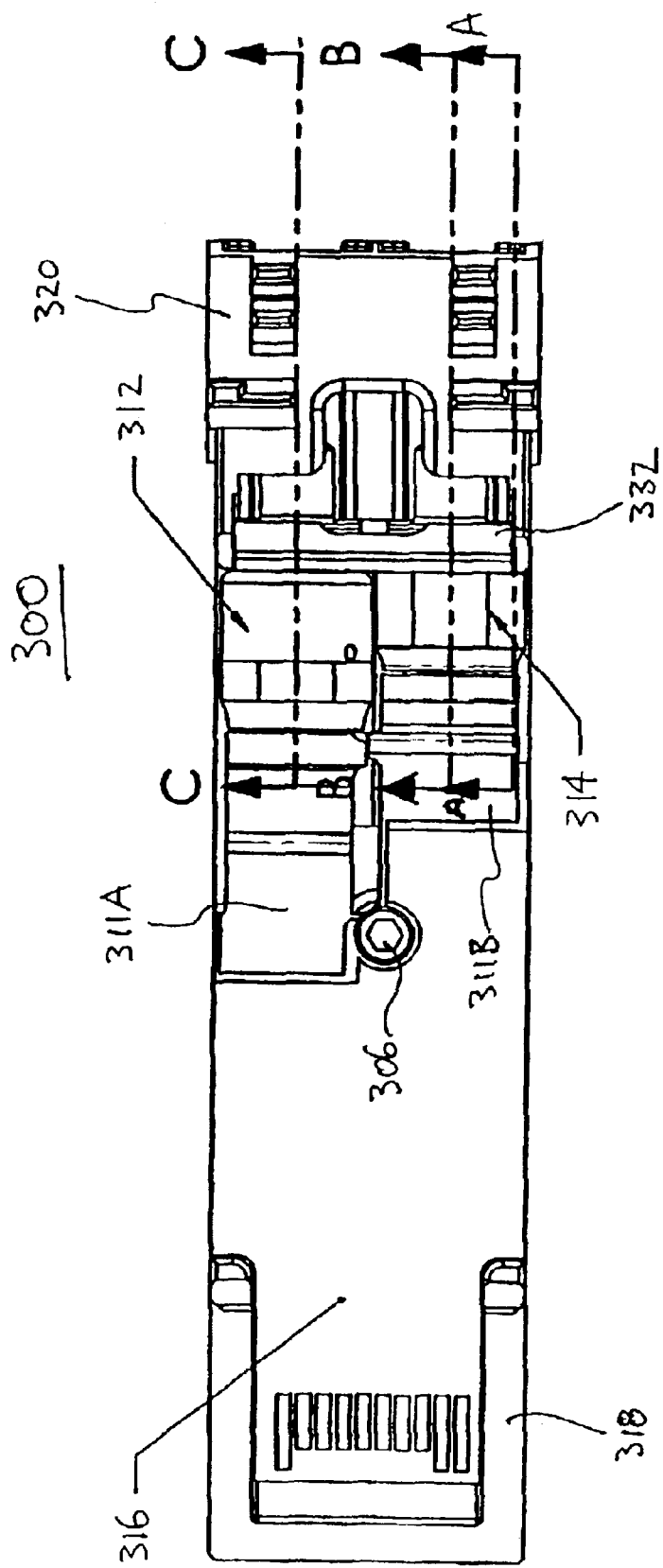
FIG. 4A is a top view of the module of FIG. 3.
Figure 4B:
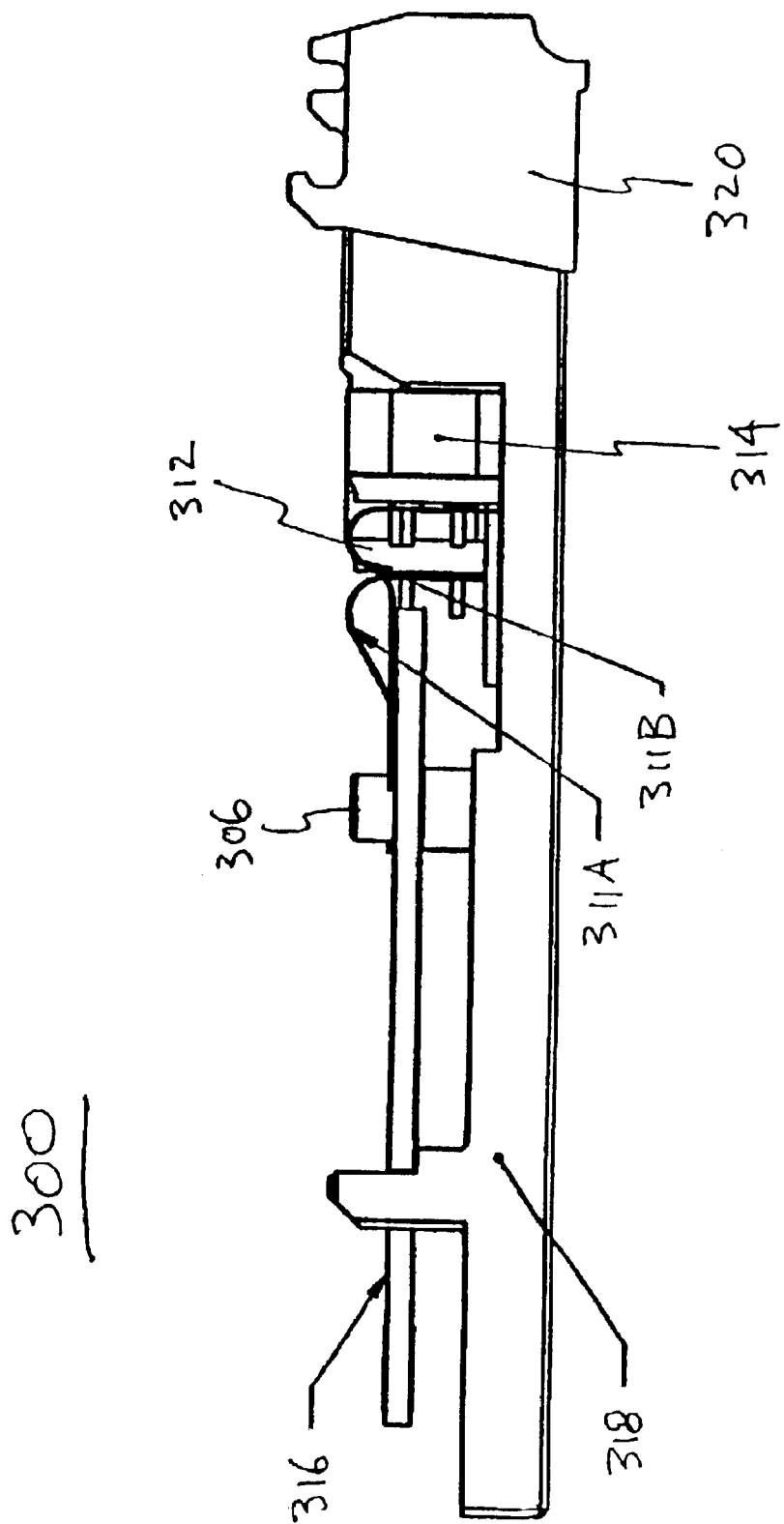
FIG. 4B is a side view of the module of FIG. 3.

FIG. 4A is a top view of an assembled module 300 and FIG. 4B is a side view of the same module. Note that the separate flex circuits may each have a different length, permitting the laser port housing and OSA to have a different length than the optical detector port housing and OSA. The restraining bar 332 is illustrated in FIGS. 4A and 4B.

Figure 5:
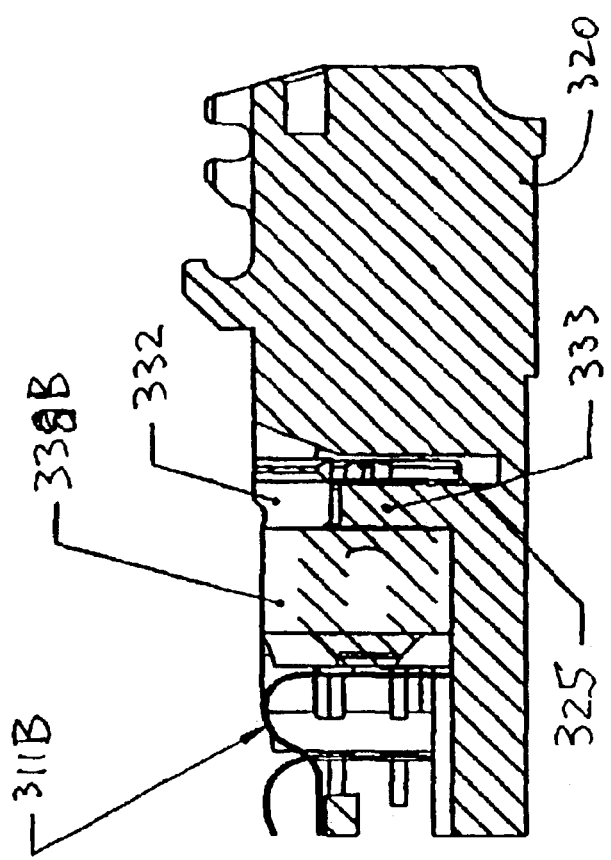
FIG. 5 is a cross-sectional view of the module of FIG. 4A along line A—A.

FIG. 5 is a cross-sectional view along line A—A of FIG. 4A showing a view of a port restraining bar (PRB) 332 and yoke 333 holding an OSA 314. In one embodiment, PRB 332 is shaped to contact the conductive cap 325 with a sufficient friction that the neck is movably coupled to yoke 333 with conductive cap 325 disposed in the front portion of connector end 320.

Figure 6:
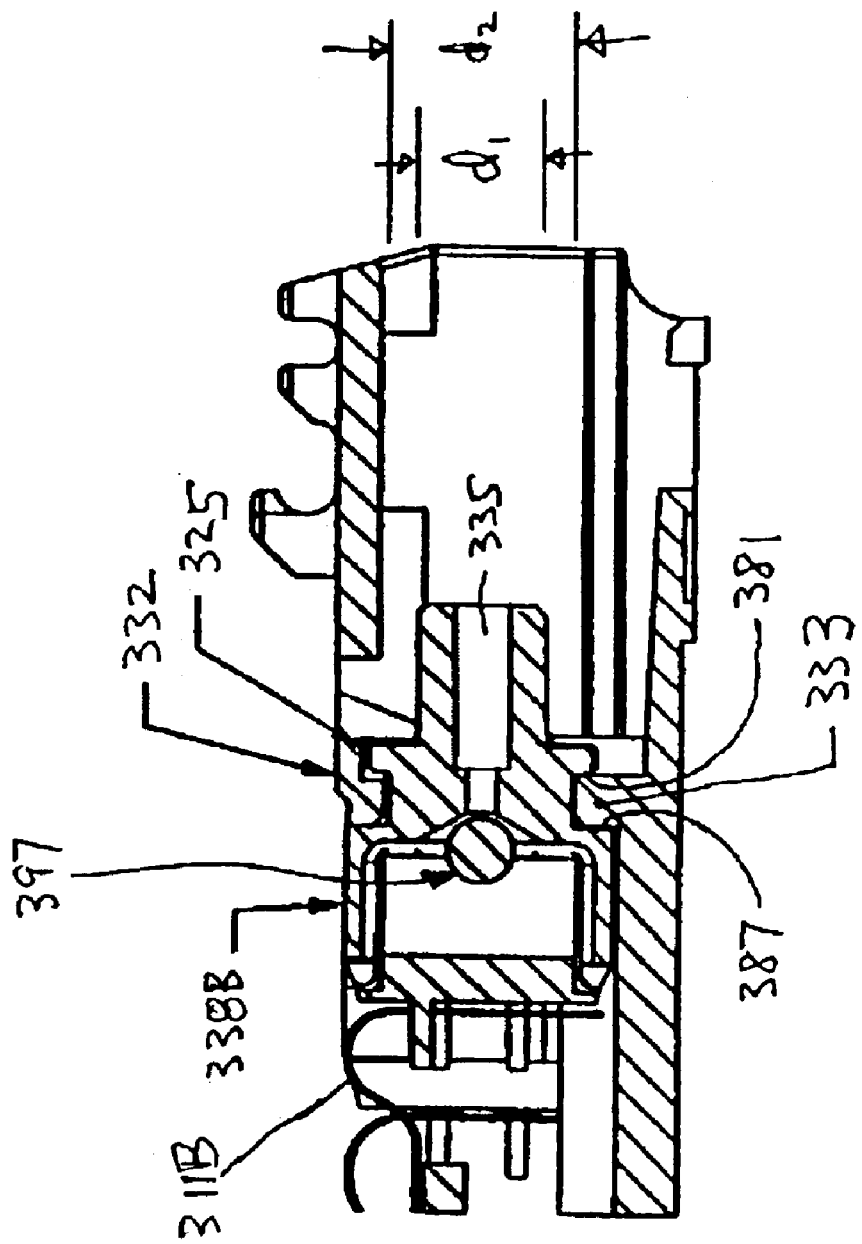
FIG. 6 is a cross-sectional view of the module of FIG. 4A along line B—B.
Figure 7:
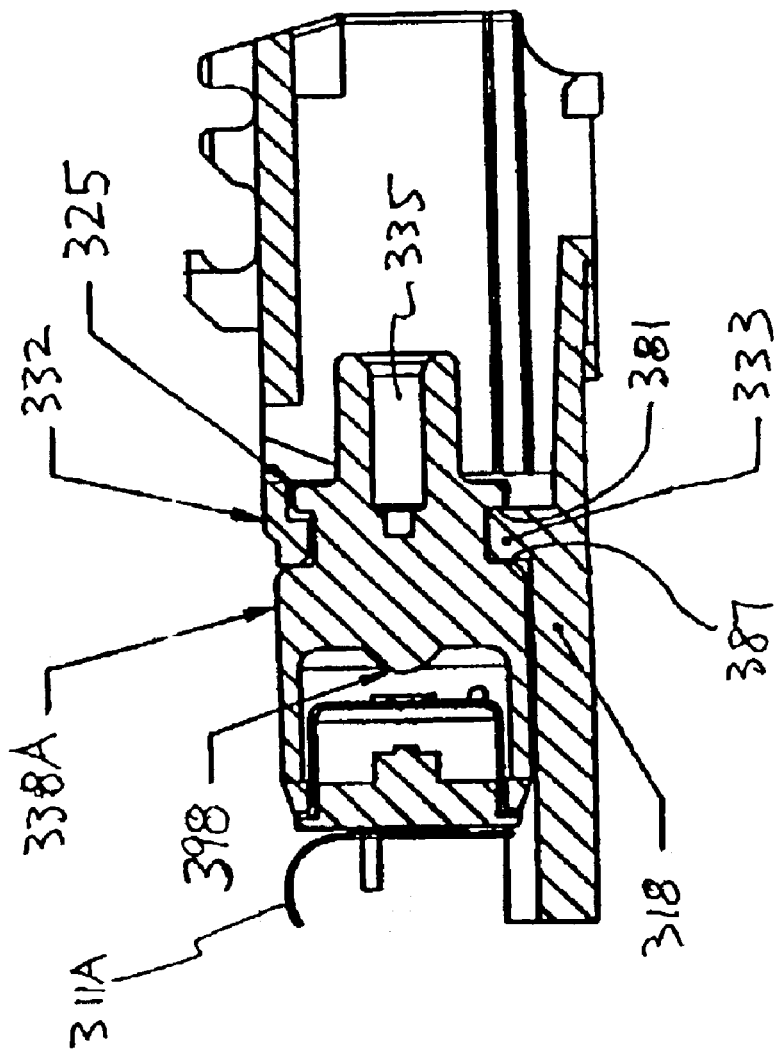
FIG. 7 is a cross-sectional view of the module of FIG. 4A along line C—C.

FIG. 6 shows a cross sectional view along line B—B of FIG. 4A through the photodiode port housing 338. The conductive cap 325 subtends the annulus of collar 334. Port restraining bar 332 and yoke 333 provide some EMI shielding. The aperture of conductive cap 325 further attenuates EMI. As can be seen in FIG. 6, cap 325 may have an inner diameter, $d_1$, that is less than that an inner diameter $d_2$, of the yoke 333. Consequently, cap increases the attenuation of EMI and also increases ESD protection. In this example, a ball lens 397 is used for optical coupling. FIG. 7 shows a corresponding cross-sectional view along line C—C through the transmitter laser port housing 338. An integrated plastic lens 398 is also shown.

The present invention provides several benefits. One benefit is that the effective aperture for EMI radiation is reduced to the inner diameter of the conductive cap. Substantially all of the area aside from the ferrule portions of the port housing may be chocked off with a conductive shield. The conductive shell, the conductive port caps, yoke, and other metal elements (e.g., the PRB) are electrically coupled together and may be suitably grounded to other elements, such as to a conductive enclosure. Moreover, in one embodiment, the shield elements are electrically coupled to an electrically conductive shell, which further facilitates protecting the PCBA electronics from ESD.

Another benefit of the present invention is that it permits each port housing a limited range of motion in response to loads. A pressure fit may be selected that engages the conductive port cap with sufficient pressure to form an electrical connection to the conductive cap. However, the port housing may still move in response to thermal expansion, mechanical loads, or vibration. This provides several advantages, since it facilitates maintaining the fiber in proper optical alignment within the ferrule of the port housing. Additionally, mechanical reliability of plastic components may also benefit.

Yet another benefit of the present invention is that the receiver port housing and the transmitter port housing may move independently of each other, facilitating each port housing maintaining reliable optical alignment to its fiber.

Still yet another benefit of the present invention is that it highly manufactured, since it requires only a comparatively low cost manufacturing step to add a conductive port cap to a plastic port housing.

While the present invention has been describe in detail with regards to a transceiver module having separate receiver and transmitter OSAs, it will be understood that the present invention may be applied to any module having one or more plastic port housings, such as receiver, transmitter, and transceiver modules. Moreover, it will be understood that the present invention is not limited to modules configured to receiver LC-type fiber connectors but may be adapted to receive a variety of connector types, such as SC, MT-RJ type or other types of connectors. Additionally, while the present invention has been described in detail in regards to plastic port housings, it will be understood that it applies more generally to any type of electrically non-conductive or poorly conductive port housing.

While particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. An optical module, comprising:
    first and second optical subassemblies, each of the first and second optical subassemblies including a respective port housing, each of which is constructed at least in part of a substantially non-conductive material, and each port housing comprising:
        a body portion for housing an optical component;
        a head portion having a bore shaped to receive an optical fiber; and
        a neck portion connecting the body portion to the head portion;
    a first optical component disposed in the port housing of the first optical subassembly;
    a second optical component disposed in the port housing of the second optical subassembly; and
    first and second electrically conductive caps configured to facilitate control of EMI, each electrically conductive cap being disposed on a respective head portion of a port housing such that a gap is present between the first and second electrically conductive caps and the first and second electrically conductive caps do not contact each other.

2. The optical module as recited in claim 1, wherein at least one of the port housings substantially comprises plastic.

3. The optical module as recited in claim 1, wherein each of the first and second optical components comprises one of: an optical detector; and, an optical transmitter.

4. The optical module as recited in claim 1, wherein the first optical subassembly comprises a ROSA, and the second optical subassembly comprises a TOSA.

5. The optical module as recited in claim 1,wherein at least one of the first and second electrically conductive caps comprises an internal tooth star washer.

6. The optical module as recited in claim 1, wherein the first and second electrically conductive caps electrical communication with each other.

7. The optical module as recited in claim 1, wherein each of the first and second electrically conductive caps is configured for motion independent of the other electrically conductive cap.

8. The optical module as recited in claim 1, wherein at least one of the first and second electrically conductive caps is substantially circular in shape so that inner and outer diameters of the at least one electrically conductive cap are defined.

9. The optical module as recited in claim 1, wherein at least one of the port housings further comprises a collar upon which the corresponding electrically conductive cap at least partially resides.

10. The optical module as recited in claim 1, wherein each optical subassembly is configured to move independently of the other.

11. The optical module as recited in claim 1, further comprising an electrically conductive shell wherein the optical subassemblies are at least partially disposed, at least one of the electrically conductive caps being in contact with the shell.

12. The optical module as recited in claim 1, further comprising at least one plastic lens configured and arranged for optical communication with at least one of the optical components.

13. The optical module as recited in claim 1, further comprising an electrically conductive yoke and electrically conductive restraining bar that cooperate with each other to define a pair of openings, each of the openings receiving at least part of a respective neck portion of a port housing.

14. The optical module as recited in claim 13, wherein at least one of the electrically conductive caps is in contact with at least one of: the yoke; and, the restraining bar.

15. The optical module as recited in claim 13, wherein an inside diameter of at least one of the electrically conductive caps is relatively smaller than a diameter of the corresponding opening collectively defined by the yoke and restraining bar.

16. The optical module as recited in claim 1, further comprising a printed circuit board configured to communicate with at least one of the optical subassemblies by way of a flex circuit.

17. An optical module, comprising:
    first and second optical subassemblies, each of which is configured and arranged for motion independent of the other, each of the first and second optical subassemblies including a respective port housing constructed at least in part of a substantially non-conductive material, and each port housing comprising:
        a body portion for housing an optical component;
        a head portion having a bore shaped to receive an optical fiber; and
        a neck portion connecting the body portion to the head portion;
    a first optical component disposed in the port housing of the first optical subassembly;
    a second optical component disposed in the port housing of the second optical subassembly; and
    first and second electrically conductive caps configured to facilitate control of EMI, each electrically conductive cap being disposed on a respective head portion of a port housing such that a gap is present between the first and second electrically conductive caps and the first and second electrically conductive caps do not contact each other.

18. The optical module as recited in claim 17, wherein each of the electrically conductive caps is configured and arranged for motion independent of the other electrically conductive cap.

19. The optical module as recited in claim 17, wherein at least one of the port housings substantially comprises plastic.

20. The optical module as recited in claim 17, wherein the first optical subassembly comprises a ROSA, and the second optical subassembly comprises a TOSA.

21. The optical module as recited in claim 17, wherein at least one of the first and second electrically conductive caps comprises an internal tooth star washer.

22. The optical module as recited in claim 17, wherein at least one of the first and second electrically conductive caps is substantially circular in shape so that inner and outer diameters of the at least one electrically conductive cap are defined.

23. The optical module as recited in claim 17, wherein the first and second electrically conductive caps are in electrical communication with each other.

24. The optical module as recited in claim 17, further comprising an electrically conductive yoke and electrically conductive restraining bar that cooperate with each other to define a pair of openings, each of the openings receiving at least part of a respective neck portion of a port housing.

25. The optical module as recited in claim 24, wherein at least one of the electrically conductive caps is in contact with at least one of: the yoke; and, the restraining bar.

26. The optical module as recited in claim 24, wherein an inside diameter of at least one of the electrically conductive caps is relatively smaller than a diameter of the corresponding opening collectively defined by the yoke and restraining bar.

27. An optical module, comprising:
    an electrically conductive shell;
    an electrically conductive yoke substantially disclosed within the shell;
    an electrically conductive restraining bar that cooperates with the electrically conductive yoke to substantially define a pair of openings;
    first and second optical subassemblies substantially disposed within the electrically conductive shell and configured and arranged for motion independent of each other, the optical subassemblies including respective port housings constructed at least in part of a substantially non-conductive material, and each port housing comprising:
        a body portion for housing an optical component;
        a head portion having a bore shaped to receive an optical fiber; and
        a neck portion connecting the body portion to the head portion, each neck portion being at least partially received within a corresponding opening collectively defined by the yoke and the restraining bar;
    a first optical component disposed in the port housing of the first optical subassembly;
    a second optical component disposed in the port housing of the second optical subassembly; and
    first and second electrically conductive caps configured to cooperate with at least one other conductive element of the optical module to facilitate EMI control, each electrically conductive cap being disposed on a respective head portion of a port housing, and the electrically conductive caps being configured and arranged such that a gap is present between the first and second electrically conductive caps and the first and second electrically conductive caps do not contact each other.

28. The optical module as recited in claim 27, wherein the first and second optical subassemblies are each configured and arranged for motion relative to the yoke and restraining bar.

29. The optical module as recited in claim 27, wherein the at least one conductive element of the optical module with which the first and second electrically conductive caps cooperate to facilitate EMI control comprises at least one of: the electrically conductive shell; the electrically conductive yoke; and, the electrically conductive restraining bar.

30. The optical module as recited in claim 27, wherein at least one of the first and second electrically conductive caps is in contact with at least one of: the electrically conductive shell; the electrically conductive yoke; and, the electrically conductive restraining bar.

31. The optical module as recited in claim 27, wherein at least one of the first and second electrically conductive caps has an inner diameter relatively smaller than a diameter of an opening cooperatively defined by the restraining bar and the yoke.

32. The optical module as recited in claim 27, wherein at least one of the port housings is substantially constructed of plastic.

33. An EMI control system suitable for use in connection with an optical module having an electrically conductive shell that at least partially houses first and second optical subassemblies that each include a respective port housing, the EMI control system comprising:

first and second electrically conductive caps, each electrically conductive cap being sized and configured so that when disposed on respective port housing, a gap exists between the first and second electrically conductive caps and the first and second electrically conductive caps do not contact each other;

an electrically conductive yoke; and an electrically conductive restraining bar that cooperates with the electrically conductive yoke to substantially define a pair of openings, each of which is sized and configured to receive a portion of a port housing, the electrically conductive restraining bar being in electrical communication with at least one of: the first electrically conductive cap; the second electrically conductive car; and, the electrically conductive yoke.

34. The EMI control system as recited in claim 33, wherein at least one of the first and second electrically conductive caps has an inner diameter relatively smaller than a diameter of an opening cooperatively defined by the restraining bar and the yoke.

35. The EMI control system as recited in claim 33, wherein at least one electrically conductive component of the EMI control system is in contact with at least one other electrically conductive component of the EMI control system.

36. The EMI control system as recited in claim 33, wherein at least one of the first and second electrically conductive caps comprises an internal tooth star washer.

37. The EMI control system as recited in claim 33, wherein at least a portion of the EMI control system is configured and arranged for electrical communication with the electrically conductive shell of the optical module.

* * * * *

UNITED STATES PATENT AND TRADEMARK OFFICE
CERTIFICATE OF CORRECTION

| | |
|---|---|
| PATENT NO. | : 6,817,782 B2 |
| APPLICATION NO. | : 10/367435 |
| DATED | : November 16, 2004 |
| INVENTOR(S) | : Togami et al. |

It is certified that error appears in the above-identified patent and that said Letters Patent is hereby corrected as shown below:

On The Title Page
Item (56), under "U.S. PATENT DOCUMENTS", after "2002/0131122 Al   9/2002" change "Anderi et al." to --Anderl et al.--
Item (56), under "OTHER PUBLICATIONS", line 2, change "Jcan M. Trewhella," to --Jean M. Trewhella,--

Column 1,
Line 39, after "plastic port" change "housing" to --housings--
Line 56, after "an optical coupling end" change "," to --;--

Column 2,
Line 12, change "accord" to --accordance--

Column 4,
Line 38, after "such as" insert --a--
Line 43, after "port housing" change "338." to --338A.--
Line 45, after "housing" change "338." to --339A.--
Line 52, after "to fit onto" remove "the"

Column 5,
Line 15, before "increases the attenuation" insert --325--
Line 25, after "housing may be" change "chocked off" to --blocked off--
Line 49, change "highly manufactured," to --is highly manufacturable,--
Line 52, change "has been describe" to --has been described--

Column 6,
Line 45, after "conductive caps" insert --are in--

UNITED STATES PATENT AND TRADEMARK OFFICE
CERTIFICATE OF CORRECTION

PATENT NO. : 6,817,782 B2
APPLICATION NO. : 10/367435
DATED : November 16, 2004
INVENTOR(S) : Togami et al.

It is certified that error appears in the above-identified patent and that said Letters Patent is hereby corrected as shown below:

Column 9,
Line 8, before "respective port housing," insert --a--

Signed and Sealed this

Twenty-first Day of August, 2007

JON W. DUDAS
*Director of the United States Patent and Trademark Office*